United States Patent [19]

Le Mehauté et al.

[11] Patent Number: 4,965,746
[45] Date of Patent: Oct. 23, 1990

[54] RECURSIVE-TYPE PERIODIC TEMPORAL SIGNAL GENERATOR

[75] Inventors: Alain Le Mehauté, Gif Sur Yvette; Jean-Francois Quiniou, Besancon; Claude Roques-Carmes, Besancon; Dalloul Wehbi, Bensancon; Antoine Derossis, Marcoussis, all of France

[73] Assignee: Compagnie Generale D'Electricite, Paris, France

[21] Appl. No.: 286,819

[22] Filed: Dec. 20, 1988

[30] Foreign Application Priority Data

Dec. 21, 1987 [FR] France ................... 87 17810

[51] Int. Cl.[5] .................. G06F 1/025; H03K 3/64
[52] U.S. Cl. ................................. 364/518; 377/33; 307/260
[58] Field of Search ............... 377/33; 307/479, 269, 307/260; 364/518, 522, 514

[56] References Cited

U.S. PATENT DOCUMENTS

| | | | |
|---|---|---|---|
| 3,944,858 | 3/1976 | Petersson | 307/269 |
| 4,646,251 | 2/1987 | Hayes et al. | 364/518 |
| 4,694,407 | 9/1987 | Ogden | 364/518 |

FOREIGN PATENT DOCUMENTS 2618823 11/1977 Fed. Rep. of Germany .
2176678 12/1986 United Kingdom .

OTHER PUBLICATIONS

L'Onde Electrique, vol. 58, No. 11, Nov. 1978, pp. 747–746, P. Minot, "Sequences Anharmoniques".

Primary Examiner—Gary V. Harkcom
Assistant Examiner—Raymond J. Bayerl
Attorney, Agent, or Firm—Sughrue, Mion, Zinn, Macpeak & Seas

[57] ABSTRACT

The temporal signal generated has a periodic configuration defined by an arrangement of seed patterns resulting from a branching construction employing n successive applications of m pattern type laws each defined by a specific arrangement of p pattern types. This construction amounts to defining a periodic signal configuration as a component "an" of the nth term Un with several components (an, bn) of a recurrent sequence defined at the level of its components by a particular recurrent composition law, the initial term UO having for its components the seed patterns (aO, bO). The temporal signals known by the name "fractal" result from a branching construction of this kind. The generator comprises an elementary signal forms generator circuit (20) corresponding to the definitions of the seed patterns, an m-digit counter (30) to base p incremented when each elementary signal form is delivered by the elementary forms generator circuit (20) and a pattern type selector circuit (40) controlled by the counter (30) to base p and controlling the elementary forms generator circuit (20).

3 Claims, 3 Drawing Sheets

RECURSIVE-TYPE PERIODIC TEMPORAL SIGNAL GENERATOR

BACKGROUND OF THE INVENTION

The present invention concerns periodic temporal signals the configuration of which over a time period is defined by an arrangement of seed patterns of different types resulting from a recursive construction using successively applied recurrent pattern type composition laws each defined by a specific arrangement of p pattern types possibly identical to each other. Generally speaking, the configuration over a time period of a temporal signal resulting from this kind of recursive construction may be considered as a component "$a_n$" of the Nth term $U_n$ with m components ($a_n$, $b_n$, $c_n$ etc.), one per pattern type, of a recurrent sequence, this nth term being defined at the level of its components ($a_n$, $b_n$, $c_n$ etc.) according to the components ($a_{(n-1)}$, $b_{(n-1)}$, $c_{(n-1)}$, etc..) of the preceding term $U_{n-1}$ by the recurrent pattern type composition laws and the initial term $U_0$ of the sequence having for its components ($a_0$, $b_0$, $c_0$, etc.) the seed patterns.

The recursive construction process makes it possible to increase the complexity of the pattern obtained from one iteration to another extremely quickly. It produces after very few iterations a signal pattern having the general appearance of a random signal although it is in fact highly structured and has self-simulating properties independent of the scale factor.

Because of these characteristics the resultant temporal signal finds beneficial applications in varied techniques including vibration testing, transducers and stimulators, fabrication of Cantorian macromolecules by electrosynthesis and, in a general way, quasi-crystals. Temporal signals known by the name fractal signals result from a recursive construction of this kind, but the construction described here is more general.

SUMMARY OF THE INVENTION

An object of the present invention is a temporal signal generator enabling signals of the aforementioned type to be generated very quickly.

The recursive periodic temporal signal generator in accordance with the present invention comprises: means for breaking down the pattern of a periodic signal configuration into a succession of seed patterns and means for supplying signal forms corresponding to the various seed patterns appearing in the succession. The means for breaking down the pattern relating to one period comprise means for counting to the base p where p is the number of pattern elements defining the recurrent laws, which counting means supply a number on n digits and are incremented at the rate at which the seed patterns change in the breakdown of the periodic configuration pattern, and pattern type selection means conditioned by the number supplied by the counting means to base p.

In one specific embodiment the pattern type selection means comprise:

memory means storing in a two-dimensional array m sequences of p data items corresponding to m arrangements of p pattern elements defining the recurrent laws and comprising a row addressing input for selecting any of the m sequences and a column addressing input for selecting a data item at a specific rank in the sequence preselected by the row addressing means, parallel-serial conversion means for serializing the number supplied by the counter to base p and applying the digits of this number in decreasing weight order in succession to the column addressing input of said memory means, and loop means for transmitting the data item available in read mode in said memory means to the row addressing input of the same means with a time-delay relative to the successive applications to the column addressing input of the same means of the digits of the number delivered by the counter to base p.

BRIEF DESCRIPTION OF THE DRAWINGS

Other characteristics and advantages of the invention will emerge from the description of various embodiments given by way of example. This description will be given with reference to the drawings in which.

DETAILED DESCRIPTION OF THE INVENTION

Figure 1:
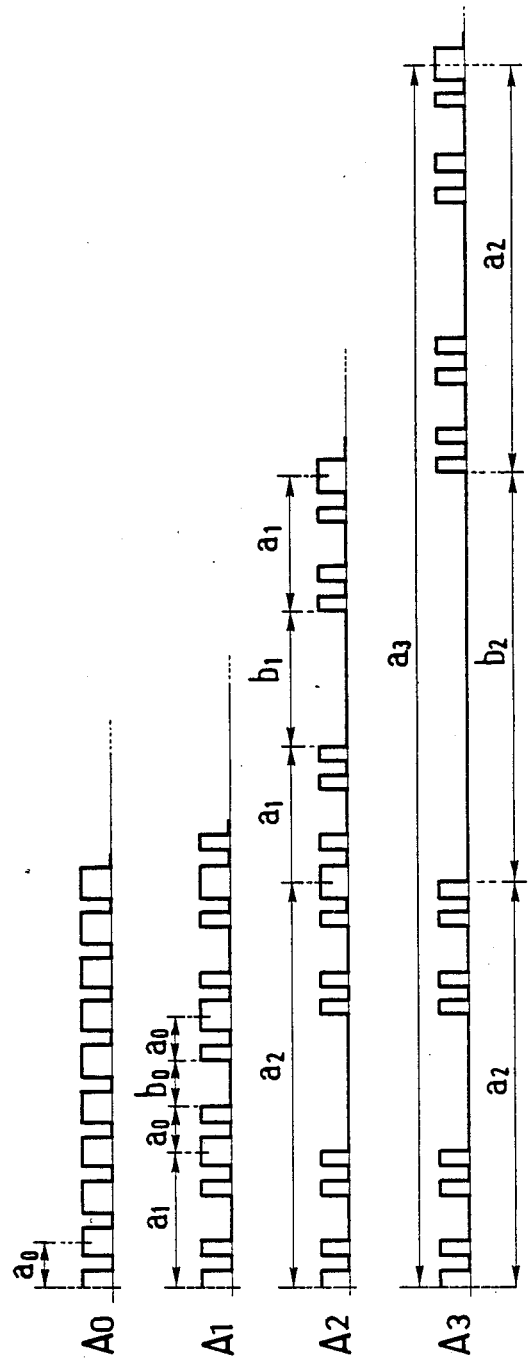
FIG. 1 is a timing diagram showing by means of signal examples the extremely rapid increase in the complexity of the pattern over a period obtained by the branching construction process.

FIG. 1 gives an example of the definition of a temporal binary signal by means of a sequence "$a_n$" of values which represent regular sampling of one of the periods of the signal and which is obtained by a branching construction utilizing two seed patterns:

$a_0$ = 1 0 1
$b_0$ = 0 0 0 associated with two recurrent pattern type composition laws:

$a_n = a_n - 1 b_n - 1 a_n - 1$
$b_n = b_n - 1 b_n - 1 b_n - 1$

Each ith step of the construction leading to the definition of the pattern "$a_i$" necessitates a knowledge of the pair of patterns a(i−1) b(i−1) obtained in the previous step which may be regarded as the components of a term U(i−1) of a recurrent sequence comprising three pattern elements having an initial term $U_0$ made up of the seed patterns $a_0$, $b_0$ themselves comprising three elements.

In the present case the two composition laws adopted make it possible to define the period of the binary signal obtained by recursion from the elementary pattern 101 in the manner in which CANTOR obtains his geometrical or diadic cut-outs (cf B. Mandelbrot "The Geometry of the Nature", Freedmann—1982) and so to obtain a fractal signal.

The curved $A_0$ represents by way of example the temporal signal having for its periodic configuration the seed pattern $a_0$. It is a regular periodic squarewave signal made up of pulses with a mark-space ratio of 2:1.

The curve $A_1$ shows the temporal signal having for its periodic configuration the pattern $a_1$ deduced from the seed patterns $a_0$, $b_0$ after one application of the pattern composition laws:

$a_1 = a_0 b_0 a_0$
$a_1$ = 1 0 1 0 0 0 1 0 1

This signal is a slightly irregular binary signal with unitary width and double width pulses and a period three times longer than the previous signal.

The curve $A_2$ shows the temporal signal having for its periodic configuration the pattern $A_2$ deduced from the seed patterns $a_0$, $b_0$ by applying the recurrent composition laws twice:

$a_2 = a_1\ b_1\ a_1$ $a_2 = a_0\ b_0\ a_0\ b_0\ b_0\ b_0\ a_0\ b_0\ a_0$ $a_2 = 101000101000000000101000101$

This is a binary signal clearly more irregular than the previous signal with pulses for the most part of unitary width.

The curve $A_3$ represents the temporal signal having for its periodic configuration the pattern $a_3$ The curve $A_3$ represents the temporal signal having for its periodic configuration the pattern $a_3$ deduced from the seed patterns $a_0$, $b_0$ by applying the pattern type composition laws three times:

$a_3 = a_2\ b_2\ a_2$ $a_3 = a_1\ b_1\ a_1\ b_1\ b_1\ b_1\ a_1\ b_1\ a_1$ $a_3 = a_0\ b_0\ a_0\ b_0\ b_0\ b_0\ a_0\ b_0\ a_0\ b_0\ b_0\ b_0\ b_0\ b_0\ b_0\ b_0\ b_0\ a_0$ $b_0\ a_0\ \ldots$ This is a binary signal that is even more irregular than the previous one and has a period three times as long as that of the previous signal.

Each time the recurrent pattern type composition laws are applied the number of pattern elements is increased by three. This growth law reaches very high values quickly since on the thirteenth application of the recurrent laws the value is already:

$3^{14} = 4\ 782\ 969$ which for a temporal signal defined by sequential samples at the rate of one per second corresponds to a duration in excess of one thousand hours (one month). A signal of this kind looks like a random signal although it is very highly structured and formed of pulses having a Cantorian organisation giving it self-simulating properties irrespective of the scale of temporal analysis and which make it particularly useful in various techniques including the manufacture of fractal macromolecules by electrosynthesis, metal or ceramic materials under vibration, vibration testing in mechanical engineering for predicting the long-term behavior of certain materials (friction surfaces, for example), the excitation of transducers and stimulators and all techniques conventionally utilizing spectral and correlation considerations.

Figure 2:
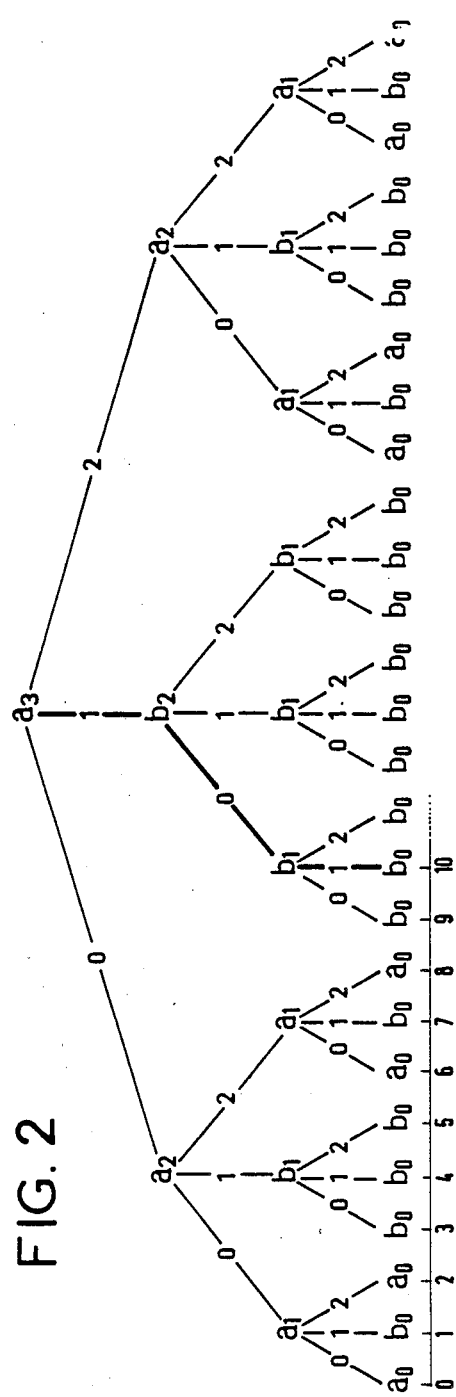
FIG. 2 shows the branching construction yielding the signal forms shown in FIG. 1.

FIG. 2 shows the recursive construction leading to the breaking down into seed patterns $a_0$, $b_0$ of the pattern $a_3$ of the signal $A_3$ from FIG. 1. The pattern $a_3$ is initially broken down into patterns $a_2$, $b_2$ by application of the type a recurrent pattern composition law. This yields:

$a_3 = a_2\ b_2\ a_2$

The patterns $a_2\ b_2$ are then themselves broken down into patterns $a_1$, $b_1$ by applying the type a and b recurrent pattern composition laws to yield:

$a_3 = a_1\ b_1\ a_1\ b_1\ b_1\ b_1\ a_1\ b_1\ a_1$

The patterns $a_1\ b_1$ are finally broken down into seed patterns $a_0\ b_0$ by further application of the type a and b recurrent pattern composition laws to yield the final result:

$a_3 = a_0\ b_0\ a_0\ b_0\ b_0\ b_0\ a_0\ b_0\ a_0\ b_0\ b_0\ b_0\ b_0\ b_0\ b_0\ b_0\ a_0\ b_0$ $a_0\ b_0\ b_0\ b_0\ a_0\ b_0\ a_0$

Note that if the seed patterns $a_0\ b_0$ are numbered in their order of occurrence in the pattern $a_3$ and if the number obtained is expressed to base 3 on three digits there is obtained a marking of the routing leading in the branching construction of the pattern $a_3$ to the seed pattern in question, designating from left to right the three branches of the first ramification by the values 0, 1 and 2 of the most significant digit, the three branches of each second ramification by the values 0, 1 and 2 of the intermediate digit and the three branches of each third ramification by the values 0, 1 and 2 of the least significant digit. Thus the seed pattern $b_0$ at the tenth position has a rank of 101 to base 3:

$(10)_{10} = (101)_3$ and is obtained by following the routing shown in thicker line from $a_3$ to $b_2$ chosen because of the value 1 of the most significant digit of its rank to base 3 and then the routing from $b_2$ to $b_1$ chosen because of the value 0 of the intermediate digit of its rank to base 3 and finally the routing from $b_1$ to $b_0$ chosen because of the value 1 of the most significant digit of its rank to base 3. Following this routing does not necessitate a knowledge of the general topography of the branching construction because the marking of the branches at each branching point coincides with the rank as counted from zero of the pattern type of the point of arrival in the recurrent pattern type composition law of the branching. Thus the first segment of the routing leading to the seed pattern type at the tenth position in the breakdown of the pattern $a_3$ has for its point of departure the pattern $a_3$ and for its point of arrival the pattern $b_2$ since the tenth position is expressed to base 3 by the three-digit number:

$(10)_{10} = (101)_3$ having for its most significant digit the value 1 which designates the arrival pattern type as being that occuring at the tenth rank in the original recurrent pattern type composition law, in this case a:

$a_n = a_{n-1}\ b_{n-1}\ a_{n-1}$

The second segment of the routing therefore has the pattern $b_2$ as its point of departure. Its point of arrival is the pattern $b_1$ because the center digit of the number to base 3 expressing the tenth position is zero and designates the arrival pattern type as that occuring at the first rank in the original recurrent pattern type composition law, in this case b:

$b_n = b_{n-1}\ b_{n-1}\ b_{n-1}$

The point of departure for the third segment of the routing is then the pattern $b_1$. Its point of arrival is the pattern $b_0$ because the least significant digit of the number to base 3 expressing the tenth position is 1 and designates the arrival pattern type as that occuring at the tenth rank of the original recurrent pattern type composition law, in this case b:

$b_n = b_{n-1}\ b_{n-1}\ b_{n-1}$

It is therefore possible to determine the type of a seed pattern operative in the breakdown of the pattern $a_3$ from a knowledge of its rank in this breakdown and of the recurrent pattern type composition laws. More generally, this is true if the recurrent pattern type composition laws are all expressed by arrangements of the same number p of pattern types, with some pattern types possibly being repeated, the determination then involving the expression of the rank of the position of the seed pattern whose type is being looked for by an n-digit number to base p where n is the number of applications of the recurrent pattern type composition laws or the number of stages in the branching construction.

Figure 3:
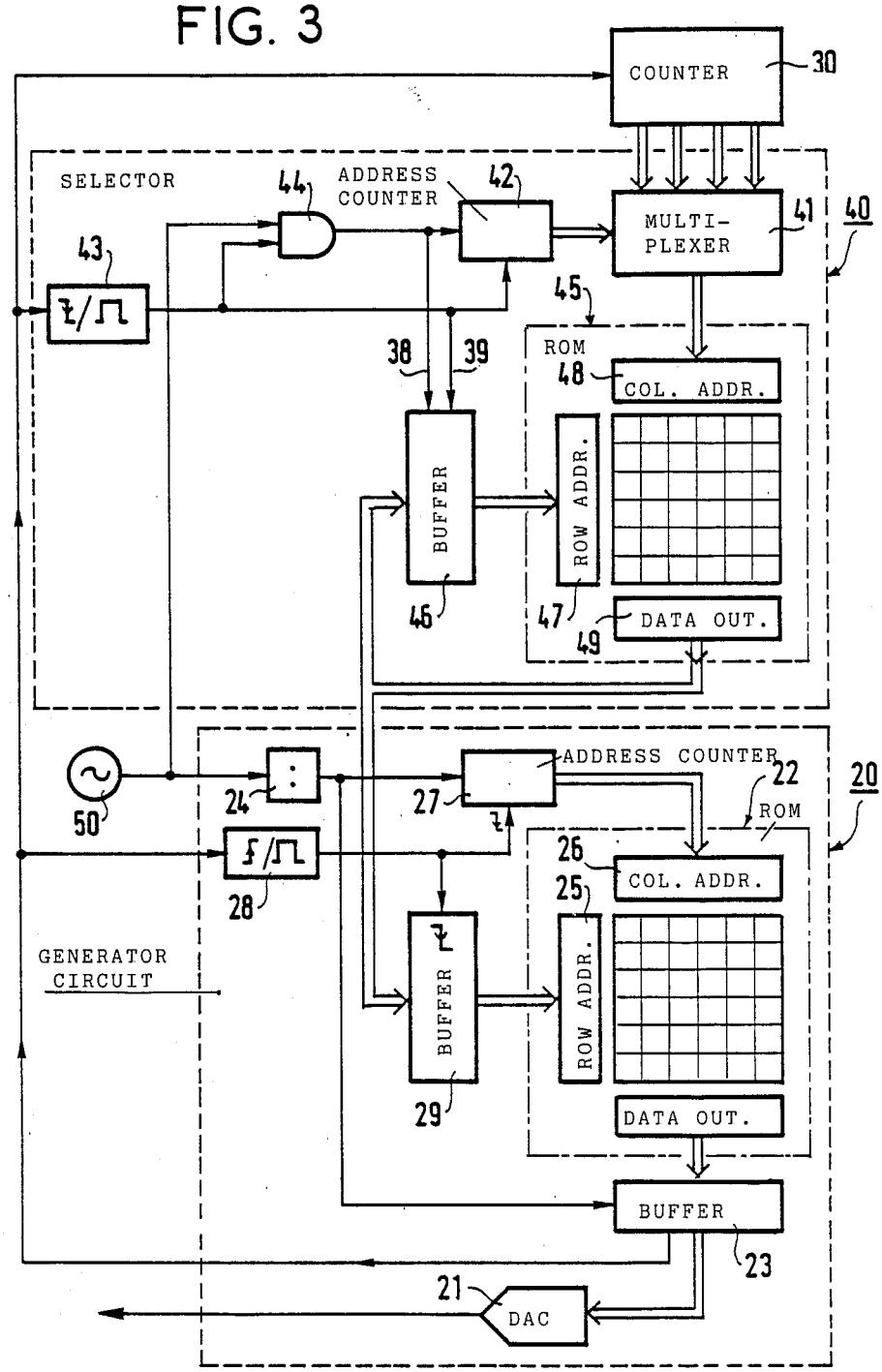
FIG. 3 shows a block schematic of a signal generator in accordance with the invention using sequential logic.

FIG. 3 shows the schematic of a signal generator using this method.

This generator may be regarded as a circuit 20 for producing elementary signal forms corresponding to the definition forms of the various seed pattern types and an n-digit counter 30 to base p incremented on each new elementary signal form delivered by the form generator circuit 20 in a seed pattern type selector circuit 40 controlled by the counter 30 and controlling the forms generator circuit 20, and an oscillator 50 defining the sampling rate of the signal supplied by the generator and controlling the succession of sequential search operations conducted by the seed pattern type selector circuit 40.

At the output of the forms generator circuit 20 is a digital-to-analog converter 21 which delivers the output signal of the generator and receives sample values read from a read-only memory 22 through a first set of buffer registers 23 written regularly at the sampling rate of the output signal as supplied by a divider circuit 24 connected to the output of the oscillator 50.

The digital-to-analog converter 21 is optionally provided with a power interface at its output for matching the characteristics of the signal it supplies to those required by the application.

The read-only memory 22 stores sequences of sample values which may be different lengths and which define the elementary signal forms corresponding to the various seed pattern types, each value having added to it a control bit which is at logic 1 when it is the last value of a sequence. The read-only memory has two addressing inputs: a row addressing input 25 for selecting a sequence of sample values corresponding to any type of seed pattern and a column addressing input 26 for selecting any rank from the sample values in the various sequences. The column addressing input 26 is scanned regularly by an address counter 27 which is incremented by the divider circuit 24 supplying the output signal sampling rate and which is reset to zero at the end of each sequence of sample values by a time-delay circuit 28 triggered when the control bit read at the output of the set of buffer registers 23 goes to logic 1. The row addressing input 25 is controlled by a second set of buffer registers 29 which samples the output signal of the seed pattern type selector circuit 40 at the times at which the address counter 27 is reset to zero under the control of the time-delay circuit 28.

The n-digit counter 30 to base p is incremented whenever the control bit read at the output of the set of buffer registers 23 goes to logic 1 and so expresses by means of an n-digit number p the order of succession of the seed patterns in the generator output signal.

The seed pattern type selector circuit 40 comprises a parallel-serial converter for serializing the n-digit number supplied in parallel form by the counter 30 to base p and delivering these n digits successively in decreasing weight order over a duration slightly less than that of the shortest seed pattern type to a sequential logic circuit for reconstituting the routing to be followed in the branching construction to determine the next seed pattern type to be generated by the forms generator circuit 20.

The parallel-serial converter comprises a multiplexer 41 with n data inputs, a data output and an addressing input, an address counter 42 connected to the addressing input of the multiplexer 41 so that, when it is incremented, the n data inputs of the multiplexer 41 are scanned in succession in an order corresponding to that of the decreasing weights of the n digits of the number delivered by the counter 30 to base p, a monostable 43 which is triggered when the control bit goes to logic zero over a duration slightly less than that of the shortest seed pattern type and maintains the address counter 42 at zero outside its triggering times, and a gate 44 connected between the oscillator 50 and the address counter 42 and opened when the monostable 43 is triggered. The frequency of the oscillator 50 and the ratio of the divider circuit 24 are chosen so that a stream of n−1 pulses appears at the input of the address counter 42 each time the monostable 43 is triggered.

The sequential logic circuit essentially comprises a read-only memory 45 the addressing system of which is partially looped through the intermediary of a third set of buffer registers 46.

The read-only memory 45 stores m sequences made up of p data items that can each take m distinct values and which correspond to the m specific arrangements of p pattern types defining the recurrent composition laws, each data item in a sequence identifying a pattern type occuring at the same rank in the corresponding arrangement. It has two addressing inputs: a row addressing input 47 for selecting the m sequences one by one and a column addressing input 48 for selecting the data items appearing at a particular rank in the sequences. The column addressing input 48 is controlled by the data output of the multiplexer 41 and the row addressing input 47 is addressed by a data item read previously and stored temporarily in the third set of buffer registers 46.

The third set of buffer registers 46 connected between the row addressing input 48 of the memory 45 and its data read output 49 is provided with presetting control means 39 connected to the reset to zero input of the address counter 42 and writing control means 38 connected to the output of the gate 44.

Each pulse which increments the address counter 42 corresponds to the end of the determination of a segment of the routing in the branching construction leading to the next seed pattern type to be generated by the forms generator circuit 20.

Outside the temporal window defined by the monostable 43 in which these pulses occur the memory 45 is addressed to determine the first segment of the routing, the third set of buffer registers 46 being preset to address in the latter the sequence of data items corresponding to the specific arrangement of the recurrent composition law of the type of the pattern "$a_n$" defining the period of the signal to be generated.

In this temporal window, before the first pulse incrementing the address counter 42 appears, the memory 45 receives on the column addressing input 48 the most significant digit of the new number established by the counter 30 to base p which leads to selection in the sequence corresponding to the recurrent pattern type law "$a_n$" preselected by the row addressing input of the data item corresponding to the destination pattern type of the first routing segment. When the first incrementing pulse appears the row and column addressing inputs of the memory 45 are modified to determine the second routing segment, its row addressing input receiving the value of the data item previously read to select the data sequence corresponding to the original recurrent pattern type law of this second segment and its column addressing input receiving the next lower weight digit of the number from the counter 30 to base p to select in this sequence the data item corresponding to the arrival pattern type of the second routing segment. As the subsequent incrementing pulses occur the process of determining the routing segments continue until, after the (n−1)th and last pulse incrementing the address counter 42, the seed pattern type to be generated by the forms generator circuit 20 is obtained and memorized by the second set of buffer registers 29 at the end of the process.

Figure 4:
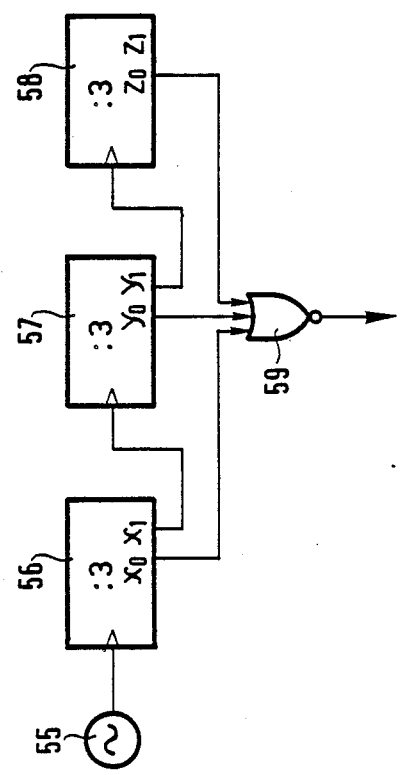
FIG. 4 shows the schematic of a signal generator in accordance with the invention using wired logic.

In the case of simple periodic configurations which use a small number of seed patterns of a small number of types corresponding to simple elementary forms it is possible to reduce the forms generator circuit and the seed pattern selector circuit to a simple wired logic circuit. FIG. 4 shows a circuit of this kind for implementing the three-level branching construction from FIG. 2 with a seed pattern type a corresponding to a signal form defined by a single sample at logic 1 and a seed pattern type b corresponding to a signal form defined by logic 0 and and obtaining a signal the periodic configuration of which corresponds to the curve $A_2$ in FIG. 2.

The three-level branching construction from FIG. 2 is defined by the recurrent pattern type composition laws:

a=a b a
b=b b b comprising arrangements of three patterns. The routing to find out the type of a seed pattern to be generated (1 or 0) is therefore determined by expressing the rank at which the pattern appears in the configuration as a three-digit number to the base 3 which can be identified in increasing weight order by the letters x, y, z and each expressed in binary by two components $x_0$, $x_1$; $y_0$ $y_1$; $z_0$, $z_1$, the index 0 marking binary weight 0 and the index 1 marking binary weight 1. Noting that in the branching construction all the routings use middle branching segments leading to seed patterns of which the ranks are expressed by a three-digit number to base 3 having at least one of the components $x_0$, $y_0$, $z_0$ at logic 1 and that all these routings and only these routings lead to seed patterns of type 0, it is seen that the seed pattern type to be generated corresponds to the value of the logic relation:

$x_0 + y_0 + z_0$

The circuit in FIG. 4 uses this method. It comprises an oscillator 55 driving a divider by three circuit with three stages 56, 57, 58. The first stage 56 delivers on two parallel outputs the components $x_0$, $x_1$ of the least significant digit and has its output $x_1$ connected to the incrementing input of the second stage 57. The latter delivers on two parallel outputs the components $y_0$, $y_1$ of the middle digit and has its output $y_1$ connected to the incrementing input of the third stage 58 which delivers on two parallel outputs the components $z_0$, $z_1$ of the most significant digit. A three-input NOR gate 59 is connected to the outputs $x_0$, $y_0$ and $z_0$ of the three stages 56, 57 and 58 of the divider by three and delivers at its output a signal whose periodic configuration corresponds to the curve $A_2$ from FIG. 1.

This circuit generates a binary signal having a period limited to 27 ($3^3$) bits and can easily be modified to generate a binary signal with a much longer period as it suffices to increase the number of stages in the divider by three and the number of inputs of the NOR gate. With three more stages the binary signal obtained has a period of 729 ($3^6$) bits.

Some arrangements may be modified and some means may be replaced by equivalent means without departing from the scope of the invention. In particular, the functions of the various circuits described could be implemented by means of a microprocessor associated with program and working memories and with various peripheral devices for programming it and producing the signal.

Obviously the recursive signal generator can be manufactured entirely using hard-wired techniques which are in all cases faster than microprocessor-based techniques.

We claim:

1. A recursive periodic temporal signal generator wherein the periodic configuration pattern is defined by an arrangement of seed patterns ($a_0$, $b_0$, . . .) of m different types (a, b, . . .), wherein m is an integer greater than one, resulting from a recursive construction employing n successive applications of m recurrent pattern type composition laws defined by arrangements of p pattern elements, where p is an integer greater than one, said recursive construction consisting in defining the periodic configuration pattern as one of the components of the nth terms Un with m components ($a_n$, $b_n$, . . .), one per pattern type, of a recurrent sequence, said nth term Un being defined at the level of its components ($a_n$, $b_n$, . . .) according to the components ($a_{n-1}$, $b_{n-1}$, . . .) of the preceding term $U_{n-1}$ by the m recurrent pattern type composition laws and the initial term $U_0$ of the sequence having for its components the seed patterns ($a_0$, $b_0$, . . .), said generator comprising means for breaking down the periodic configuration pattern into a sequence of seed patterns ($a_0$, $b_0$, . . .) and means (20) for generating signal forms corresponding to the various seed patterns appearing in the sequence and being characterized in that said means for breaking down the periodic configuration pattern comprises:

counting means (30) to base p which are incremented when the seed patterns change in the breakdown of the periodic configuration pattern and which delivers an n-digit number, and pattern type selector means (40) addressed by the counting means (30) to base p.

2. A generator according to claim 1 characterized in that said pattern type selector means (40) comprises:

memory means (45) storing in a two-dimensional array m sequences of p data items corresponding to the m arrangements of p pattern types defining the recurrent laws and having a row addressing input (47) for selecting any one of the m sequences and a column addressing input (48) for selecting a data item occuring at a particular rank in the sequence preselected by the row addressing input (47), parallel-serial conversion means (41) for serializing the number delivered by the counter (30) to base p and applying the digits of this number successively in decreasing weight order to the row addressing input (48) of the memory means (45), and loop means (46) for transmitting the data available in read mode in the memory means (45) to the row addressing input (47) of the memory means (45) with a time-delay relative to the successive applications to the column addressing input (48) of the digits of the number delivered by the counter (30) to base p.

3. A generator according to claim 1 characterized in that the pattern type selector means are implemented using wired logic circuits (59).

* * * * *